United States Patent
Cunningham et al.

(10) Patent No.: US 9,130,655 B2
(45) Date of Patent: Sep. 8, 2015

(54) METHODS AND SYSTEMS FOR DETECTING METALLIC FAULTS AFFECTING COMMUNICATIONS LINKS

(75) Inventors: Christopher C. Cunningham, Brighton, MA (US); Igor Tkachov, Arlington, MA (US); Jianming Zhu, North Billerica, MA (US)

(73) Assignee: BROADCOM CORPORATION, Irvine, CA (US)

( * ) Notice: Subject to any disclaimer, the term of this patent is extended or adjusted under 35 U.S.C. 154(b) by 158 days.

(21) Appl. No.: 13/502,199

(22) PCT Filed: Nov. 30, 2010

(86) PCT No.: PCT/US2010/058292
§ 371 (c)(1),
(2), (4) Date: May 16, 2012

(87) PCT Pub. No.: WO2011/066524
PCT Pub. Date: Jun. 3, 2011

(65) Prior Publication Data
US 2012/0232878 A1 Sep. 13, 2012

Related U.S. Application Data

(60) Provisional application No. 61/265,129, filed on Nov. 30, 2009.

(51) Int. Cl.
*H04B 3/46* (2006.01)
*H04B 3/48* (2015.01)
(Continued)

(52) U.S. Cl.
CPC .. *H04B 3/46* (2013.01); *H04B 3/48* (2013.01); *H04M 3/304* (2013.01); *H04M 11/062* (2013.01); *G01R 31/08* (2013.01)

(58) Field of Classification Search
CPC .... G01R 31/025; G01R 31/08; G01R 31/021; G01R 31/041; G01R 31/1227; G01R 31/14; H04L 12/42; H04L 1/24; H04L 41/0659; H04L 1/20; H04L 3/46; H04B 3/46; H04B 3/48; H04B 17/0042; H04B 17/004; H04M 3/304; H04M 11/062
USPC ............... 375/141, 224, 222, 285, 295, 316
See application file for complete search history.

(56) References Cited

U.S. PATENT DOCUMENTS

| | | |
|---|---|---|
| 5,475,315 A | 12/1995 | Cabot |
| 6,111,936 A | 8/2000 | Bremer |

(Continued)

FOREIGN PATENT DOCUMENTS

| | | |
|---|---|---|
| AU | 2003-262111 | 1/2004 |
| JP | A-Hei 04-175037 | 6/1992 |

(Continued)

OTHER PUBLICATIONS

Notice of Allowance for Canadian Patent Application No. 2,535,460, mailed Jan. 25, 2013

(Continued)

*Primary Examiner* — Dhaval Patel
(74) *Attorney, Agent, or Firm* — Oblon, McClelland, Maier & Neustadt, L.L.P.

(57) ABSTRACT

One exemplary aspect is to detect the presence of one or more types of faults affecting DSL communications. Upon their detection, a message can be generated that recommends corrective action. Furthermore, another exemplary aspect is to estimate the rate impact of the detected fault in some cases. One exemplary aspect of certain embodiments is to detect the presence of one or more faults that affect DSL communications, and upon their detection, generating, for example, a message that recommends corrective action. In this context, a fault can be one or more metallic faults, malfunctioning modems, or something else that affects the measured attenuation but is not normally attributable to normal DSL transmission lines.

22 Claims, 2 Drawing Sheets

(51) Int. Cl.
*H04M 3/30* (2006.01)
*H04M 11/06* (2006.01)
*G01R 31/08* (2006.01)

(56) References Cited

U.S. PATENT DOCUMENTS

| | | | |
|---|---|---|---|
| 6,192,109 | B1 | 2/2001 | Amrany et al. |
| 6,219,378 | B1 | 4/2001 | Wu |
| 6,438,212 | B1 | 8/2002 | Lysaght et al. |
| 6,456,650 | B1 | 9/2002 | Cheng et al. |
| 6,466,649 | B1 | 10/2002 | Walance et al. |
| 6,487,243 | B1 | 11/2002 | Hwang et al. |
| 6,535,580 | B1 | 3/2003 | Strauss et al. |
| 6,658,052 | B2 * | 12/2003 | Krinsky et al. ............... 375/222 |
| 6,748,016 | B1 | 6/2004 | Tzannes |
| 6,856,683 | B1 | 2/2005 | Murphy et al. |
| 7,177,419 | B2 | 2/2007 | Sedarat et al. |
| 7,558,771 | B2 * | 7/2009 | Barajas et al. .................. 706/46 |
| 7,580,471 | B2 | 8/2009 | Cunningham |
| 2001/0031048 | A1 | 10/2001 | Payne et al. |
| 2002/0114383 | A1 | 8/2002 | Belge et al. |
| 2005/0041753 | A1 | 2/2005 | Cunningham |
| 2006/0062379 | A1 | 3/2006 | Sedarat et al. |
| 2006/0098725 | A1 * | 5/2006 | Rhee et al. .................... 375/222 |
| 2009/0268797 | A1 | 10/2009 | Cunningham |
| 2011/0053528 | A1 | 3/2011 | Cunningham et al. |
| 2013/0010931 | A1 * | 1/2013 | Berg et al. ....................... 379/22 |
| 2014/0036980 | A1 | 2/2014 | Cunningham |

FOREIGN PATENT DOCUMENTS

| | | |
|---|---|---|
| JP | A-Hei 04-181852 | 6/1992 |
| JP | A-Hei 10-500540 | 1/1998 |
| JP | A-2001-519620 | 10/2001 |
| WO | WO 95/26604 | 10/1995 |
| WO | WO 99/18701 | 4/1999 |
| WO | WO 00/63709 | 10/2000 |
| WO | WO 2009/097243 | 8/2009 |

OTHER PUBLICATIONS

Decision of Refusal (including translation) for Japanese Patent Application No. 2009-214695, mailed Mar. 11, 2013.
Communication Pursuant to Rules 161(1) and 162 EPC for European Patent Application No. 09706491.9, mailed Nov. 12, 2010.
International Preliminary Report on Patentability for International Application No. PCT/US2010/058292, mailed Jun. 14, 2012.
Official Action for U.S. Appl. No. 12/864,526, mailed Jun. 26, 2013.
Notice of Allowance for U.S. Appl. No. 12/864,526, mailed Aug. 6, 2013.
Cunningham et al. "Proposal for a Standard R-Lineprobe State for G.992.3", Aug. 21, 2003.
International Search Report for International (PCT) Patent Application No. PCT/US2004/026912, mailed Dec. 9, 2004.
Written Opinion for International (PCT) Patent Application No. PCT/US2004/026912, mailed Dec. 9, 2004.
International Preliminary Report on Patentabilitiy for International (PCT) Patent Application No. PCT/US2004/026912, mailed Mar. 2, 2006.
First Examination Report for Australian Patent Application No. 2004302784, dated Jun. 2, 2009.
Notice of Acceptance for Australian Patent Application No. 2004302784, dated Oct. 15, 2009.
First Examination Report for Australian Patent Application No. 2010200127, mailed Mar. 6, 2012.
First Office Action for Chinese Patent Application No. 200480027933.4, mailed Nov. 28, 2008.
Second Office Action (including translation) for Chinese Patent Application No. 200480027933.4, mailed May 22, 2009.
First Examination Report for Indian Patent Application No. 549/KOLNP/2006, dated Sep. 27, 2007.
Office Action for European Patent Application No. 04781572.5, dated Dec. 14, 2007.
Notification of Reasons for Refusal (including translation) for Japanese Patent Application No. 2006-524035, dispatched Mar. 16, 2009.
Office Action for Canadian Patent Application No. 2,535,460, mailed Dec. 1, 2011.
Third Office Action (including translation) for Chinese Patent Application No. 200480027933.4, mailed Nov. 20, 2009.
Notification of Granting a Patent for Chinese Patent Application No. 200480027933.4, mailed Jan. 26, 2011.
Office Action for European Patent Application No. 04781572.5, dated Jan. 28, 2010.
Official Action for European Patent Application No, 04781572.5, dated Aug. 26, 2011.
Partial European Search Report for European Patent Application No. 10012113.6, dated Sep. 6, 2011.
Extended European Search Report for European Patent Application No. 10012113.6, dated Nov. 30, 2011.
Notification of Reasons for Refusal (including translation) for Japanese Patent Application No. 2006-524035, dispatched Jan. 18, 2010.
Notice of Allowance for Japanese Patent Application No. 2006-524035, mailed Aug. 30, 2010.
First Official Action (including translation) for Japanese Patent Application No. 2009-214695, mailed Sep. 3, 2012.
Official Action (including translation) for Korean Patent Application No. 10-2006-7003404, mailed Jan. 12, 2011.
Notice of Refusal for Korean Patent Application No. 10-2006-7003404, mailed Jul. 29, 2011.
Official Action (including translation) for Korean Patent Application No. 10-2009-7016184, dispatched Feb. 26, 2010.
Official Action (including translation) for Korean Patent Application No. 10-2009-7016184, mailed Dec. 28, 2010.
Notice of Allowance (including translation) for Korean Patent Application No. 10-2009-7016184, mailed Jul. 1, 2011.
Official Action for U.S. Appl. No. 10/921,857, mailed Dec. 11, 2007.
Official Action for U.S. Appl. No. 10/921,857, mailed Sep. 22, 2008.
Official Action for U.S. Appl. No. 10/921,857, mailed Dec. 24, 2008.
Notice of Allowance for U.S. Appl. No. 10/921,857, mailed Jun. 30, 2009.
Supplemental Notice of Allowance for U.S. Appl. No. 10/921,857, mailed Jul. 23, 2009.
Official Action for U.S. Appl. No. 12/498,155, mailed Aug. 6, 2010.
Official Action for U.S. Appl. No. 12/864,526, mailed Nov. 8, 2012.
Communication Pursuant to Rules 161(1) and 162 EPC for European Patent Application No. 10791017.6, mailed Jul. 27, 2012.
Notice of Acceptance for Australian Patent Application No. 2010200127, dated Dec. 7, 2012.
T1-413-1998 "Network and Customer Installation Interfaces—Asymmetric Digital Subscriber Line (ADSL) Metallic Interface" Draft American National Standards for Telecommunications, 1998, i.e., T1.413 Issue 2, 270 pages.
ITU-T Recommendation G.992.1 "Series G: Transmission Systems and Media, Digital Systems and Networks—Asymmetric Digital Subscriber Line (ADSL) Transceivers" Jun. 1999, 256 pages.
"ITU-T Recommendation G.992.3, "Asymmetric digital subscriber line transceivers 2 (ADSL2)," Jan. 2005, 436 pages".
ITU-T Recommendation G.992.5, "Asymmetric Digital Subscriber Line (ADSL) transceivers—Extended bandwidth ADSL2 (ADSL2+)," International Telecommunications Union, May 2003, 92 pages.
ITU-T Recommendation G.993.2, "Very high speed digital subscriber line transceivers 2 (VDSL2)," International Telecommunications Union, Feb. 2006, 252 pages.
ITU-T Recommendation G.9960 "Series G: Transmission Systems and Medial, Digital Systems and Networks—Unified High-Speed Wire-Line Based Home Networking Transceivers—System Architecture and Physical Layer Specification" Jun. 2010, 162 pages.
International Telecommunication Union, Recommendation G.997.1, Series G: Transmission Systems and Media, Digital Systems and Networks, Apr. 2009, 128 pages.

(56) References Cited

OTHER PUBLICATIONS

"IEEE Standard 802.11: Part 11: Wireless LAN Medium Access Control (MAC) and Physical Layer (PHY) Specifications," IEEE Standard 802. Nov. 2007, Nov. 30, 2007, pp. 1-1233.
International Search Report for International (PCT) Patent Application No. PCT/US2009/032020, mailed Apr. 27, 2009.
Written Opinion for International (PCT) Patent Application No. PCT/US2009/032020, mailed Apr. 27, 2009.
International Preliminary Report on Patentability for International (PCT) Patent Application No. PCT/US2009/032020, mailed Aug. 12, 2010.
International Search Report for International Application No. PCT/US2010/058292, mailed Mar. 29, 2011.
Written Opinion for International Application No. PCT/US2010/058292, mailed Mar. 29, 2011.

* cited by examiner

METHODS AND SYSTEMS FOR DETECTING METALLIC FAULTS AFFECTING COMMUNICATIONS LINKS

RELATED APPLICATION DATA

This application is a national stage application under 35 U.S.C. 371 of PCT Application No. PCT/US2010/058292 having an international filing date of Nov. 30, 2010, which designated the United States, which PCT application claimed the benefit of and priority under 35 U.S.C. §119(e) to U.S. Patent Application No. 61/265,129, filed Nov. 30, 2009, entitled "Methods and Systems for Detecting Metallic Faults Affecting Communications Links," each of which are incorporated herein by reference their entirety.

FIELD OF THE INVENTION

An exemplary aspect of this invention relates to communications systems. More specifically, exemplary methods, systems, means, protocols and instruction bearing computer-readable storage media, are directed toward communications system diagnostics and analysis.

SUMMARY

Some of the most problematic aspects of Digital Subscriber Line (DSL) communications (generally referred to a xDSL) are faults including but not limited to the following:
  Metallic faults such as resistances, capacitances and inductances in excess of the physical properties inherently present in the wires themselves. These electrical properties may be present in any combination. They may appear in series along either of the wires of the twisted pair, in series along both of the wires of the twisted pair, in parallel between the wires of the twisted pair, in parallel between either wire of the twisted pair and ground, in parallel between both wires of the twisted pair and ground, in parallel between either wire of the twisted pair and some other electrical conductor, in parallel between both wires of the twisted pair and some other conductor, or any combinations of these. They may be concentrated at one location or distributed along the length of the wires. The physical cause of metallic faults include but are not limited to bad electrical contacts, water ingress into the insulator, inappropriate electrical connections of conductors to each other or ground, or some other condition that affects the normal behavior of the transmission line between the transceivers.
  A malfunctioning modem on either or both ends of the line.
One exemplary aspect is to detect the presence of one of the above types of faults affecting DSL communications. This can be done either with or without necessarily being able to discriminate between them. Upon their detection, a message can be generated that recommends corrective action.

Another exemplary aspect is to estimate a rate impact of the detected fault.

One exemplary purpose of certain aspects is to detect the presence of one or more faults that affect DSL communications, and upon their detection, generate, for example, a message that recommends corrective action. In this context, a fault is one or more metallic faults, malfunctioning modems, or something else that affects the measured attenuation but is not normally attributable to normal DSL transmission lines.

Certain embodiments pertain to multi-carrier communications links such as discrete multi-tone (DMT). One of the exemplary methods may use standard-compliant links (i.e., as specified in published DSL standards such as ITU-T G.992.3/5 and G.993.2, (http://www.itu.int/rec/T-REC-G.992.3/en and http://www.itu.int/rec/T-REC-G.993.2/en, which are incorporated herein by reference in their entirety), but it is not restricted to standard compliant links. Generally, each link is full duplex, comprising both an upstream (US) direction and a downstream (DS) direction. To simplify the following description, it should be understood that all analysis can be performed for upstream signals or subchannels, downstream signals or subchannels, or both. Typically, a Power Spectral Density (PSD) is transmitted in both directions during a communications link to facilitate the analysis. The individual carriers used for the link will be referred to as "subcarriers" or "subchannels." Generally, each link is full duplex, comprising both an upstream direction and a downstream direction. A Power Spectral Density is transmitted in both directions. For standard compliant DSL as well as some nonstandard xDSL links, these PSDs are configurable, usually by adjusting subcarrier masks, PSD masks, nominal PSD levels, etc.

For standard compliant DSL links (as well as some non-standard DSL links), it is possible to observe the attenuation for each of the upstream and/or downstream subchannels used for the link. For recent ITU DSL standards (ADSL2 and beyond), this can be accomplished if the link is performed in the Loop Diagnostics Mode as defined by ITU standards for DSL, or alternatively the attenuation can be read from the MIB by using a messaging channel during Showtime, which is a term used to denote the steady-state data transmission mode for DSL. In some cases it may be possible to measure the attenuation curve if the link is not successful, but the necessary information has already been collected. For recent ITU DSL standards, the parameter HLOG is used to denote the magnitude of the attenuation per subchannel.

One exemplary embodiment observes whether the per-subchannel attenuation measured by the modems differs significantly from any attenuation curve that corresponds to a topology that could possibly occur in reality across a transmission line that does not contain a metallic fault. If a significant difference exists between the measured attenuation curve and the most similar attenuation curve corresponding to a realistic metallic-fault-free loop, then a fault can be inferred such as one or more of the faults listed above.

Aspects of the invention are thus directed toward a module capable of detecting the presence of a fault by comparing a measured attenuation curve with a best-fit attenuation curve, wherein the measured attenuation curve is reported by a modem, and the best-fit attenuation curve is derived by considering models of possible attenuation curves that could occur for loops that do not contain metallic faults.

Another aspect is directed toward a method for detecting the presence of a fault comprising comparing a measured attenuation curve with a best-fit attenuation curve, wherein the measured attenuation curve is reported by a modem, and the best-fit attenuation curve is derived by considering models of possible attenuation curves that could occur for loops that do not contain metallic faults.

Another aspect is directed toward a system for detecting the presence of a fault comprising one or more means for comparing a measured attenuation curve with a best-fit attenuation curve, wherein the measured attenuation curve is reported by a modem, and the best-fit attenuation curve is derived by considering models of possible attenuation curves that could occur for loops that do not contain metallic faults.

Yet another aspect is directed toward a non-transitory computer-readable storage media comprising information or instructions that if executed by a processor causes a comparison between a measured attenuation curve with a best-fit attenuation curve, wherein the measured attenuation curve is reported by a modem, and the best-fit attenuation curve is derived by considering models of possible attenuation curves that could occur for loops that do not contain metallic faults.

Further defining aspects of the above are directed toward a user being notified of the detection of one or more of a fault, such as a metallic fault, or malfunctioning modem.

Even further defining aspects of the above are directed toward performing additional links to identify additional faults, such as metallic faults, or malfunctioning modems.

Even further defining aspects of the above are directed toward the detection of a fault, such as a metallic fault, or malfunctioning modem being reported to a management entity via a management interface.

Even further defining aspects of the above are directed toward performing one or more of the above steps again after some corrective action to remove or mitigate a fault having been performed, such as a user installing a microfilter.

Any of the above aspects and further aspects may be located in a network management system and/or network operation device that is located inside or outside the network and/or the transceiver(s). The network operation or management device that is located inside or outside the network may be managed and/or operated by a user, consumer, service provider, utility provider or a governmental entity.

These and other features and advantages of this invention are described in, or are apparent from, the following detailed description of the exemplary embodiments.

BRIEF DESCRIPTION OF THE DRAWINGS

The exemplary embodiments of the invention will be described in detail, with reference to the following figures, wherein.

DETAILED DESCRIPTION

Figure 1:
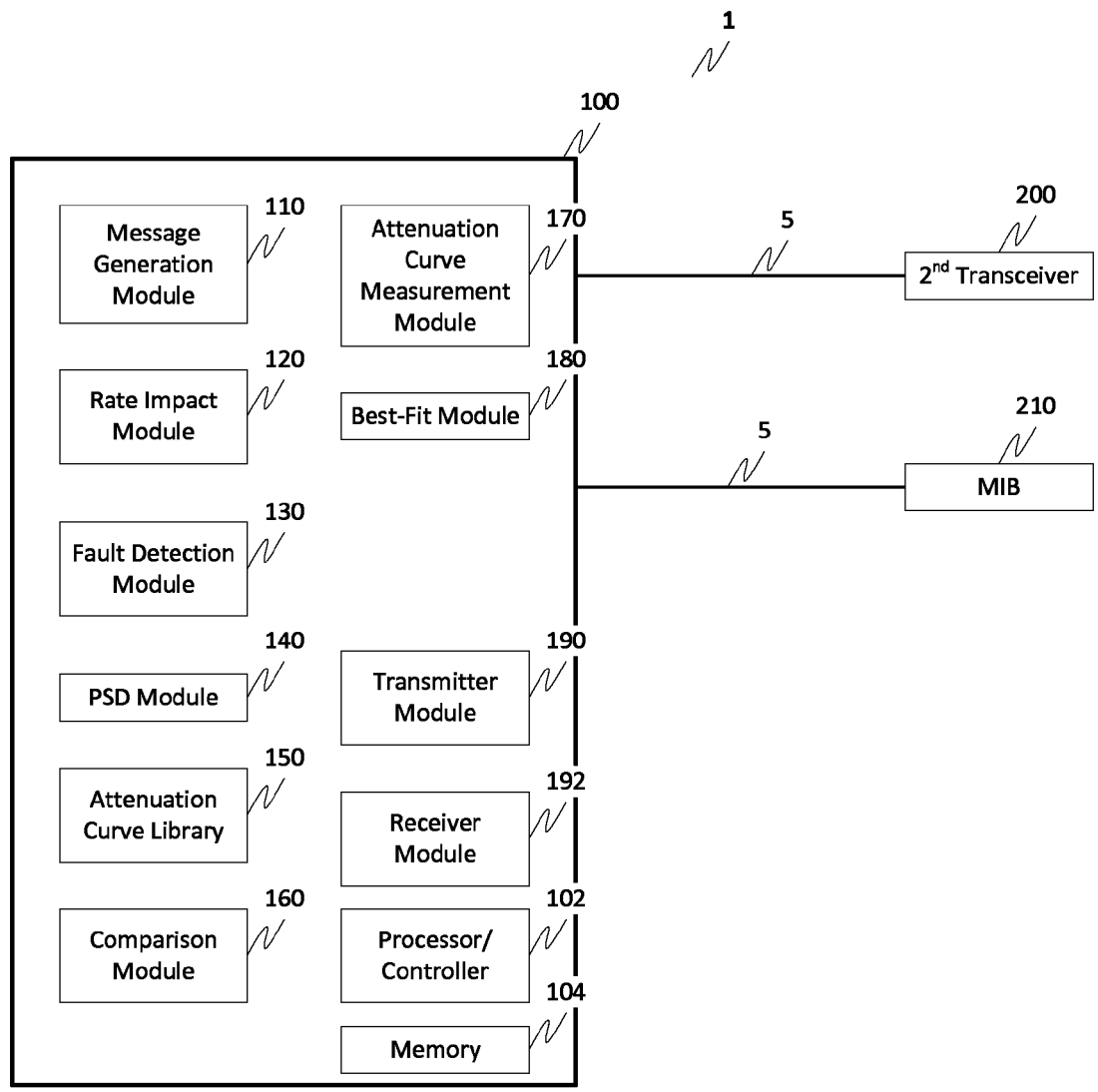
FIG. 1 illustrates an exemplary communications system.

The exemplary embodiments of this invention will be described in relation to communications systems, as well as protocols, techniques, means and methods for performing communication diagnostics, such as in a DSL or multicarrier communications environment, a home network and/or an access network, or in general any communications network operating using any communications protocol(s). Examples of such home or access networks include home powerline networks, access powerline networks, home coaxial cable network, access coaxial cable network, wireless home networks, wireless corporate networks, home telephone networks and access telephone networks. It should be appreciated however that in general, the systems, methods and techniques disclosed herein will work equally well for other types of communications environments, networks and/or protocols.

The exemplary systems and methods of this invention will also be described in relation to wired or wireless modems/ transceivers and/or a software and/or a hardware testing module, a telecommunications test device, or the like, such as a DSL modem, an ADSL modem, and xDSL modem, a VDSL modem, a line card, a G.hn transceiver, a MOCA transceiver, a Homeplug® transceiver, a power line modem, a wired or wireless modem, test equipment, a multicarrier transceiver, a wireless wide/local area network system, a satellite communications system, network-based communications systems, such as an IP, Ethernet or ATM system, a modem equipped with diagnostic capabilities, or the like, or a separate programmed general purpose computer having a communications device that is capable of operating in conjunction with any one or more of the following communications protocols: MOCA, G.hn, Homeplug, IEEE 802.11, IEEE 802.3, or the like. However, to avoid unnecessarily obscuring the present invention, the following description omits well-known structures, operations and devices that may be shown in block diagram form or are otherwise summarized or known.

For purposes of explanation, numerous details are set forth in order to provide a thorough understanding of the present invention. It should be appreciated however that the present invention may be practiced in a variety of ways beyond the specific details set forth herein. Furthermore, while the exemplary embodiments illustrated herein show various components of this system collocated, it is to be appreciated that the various components of the system can be located at distant portions of a distributed network, such as a communications network, node, within a Domain Master, and/or the Internet, or within a dedicated secured, unsecured, and/or encrypted system and/or within a network operation or management device that is located inside or outside the network. As an example, a Domain Master can also be used to refer to any device, system or module that manages and/or configures or communicates with any one or more aspects of the network or communications environment and/or transceiver(s).

Thus, it should be appreciated that the components of the system can be combined into one or more devices, or split between devices, such as a modem, a station, a Domain Master, a network operation or management device, a node or collocated on a particular node of a distributed network, such as a communications network. As will be appreciated from the following description, and for reasons of computational efficiency, the components of the system can be arranged at any location within a distributed network without affecting the operation thereof. For example, the various components can be located in a Domain Master, a node, a domain management device, such as a MIB, a network operation or management device, a transceiver(s), or some combination thereof. Similarly, one or more of the functional portions of the system could be distributed between a modem and an associated computing device/system, and/or in a dedicated test and/or measurement device.

Furthermore, it should be appreciated that the various links 5, including the communications channel(s) connecting the elements can be wired or wireless links or any combination thereof, or any other known or later developed element(s) capable of supplying and/or communicating data to and from the connected elements. The term module as used herein can refer to any known or later developed hardware, software, firmware, or combination thereof, that is capable of performing the functionality associated with that element. The terms determine, calculate, and compute and variations thereof, as used herein are used interchangeable and include any type of methodology, process, technique, mathematical operational or protocol. The terms transceiver and modem are also used interchangeably herein. The terms transmitting modem and transmitting transceiver as well as receiving modem and receiving transceiver are also used interchangeably herein.

The term management interface (e.g., MIB 200) includes any type of interface between a management entity(ies) and/ or technician(s) and a transceiver(s), such as, a CO-MIB or CPE-MIB as described, for example, in ITU Standard G.997.1, which is incorporated herein by reference in its entirety.

Moreover, while some of the exemplary embodiments described herein are directed toward a transmitter portion of a transceiver performing certain functions, this disclosure is intended to include corresponding receiver-side functionality in both the same transceiver and/or another transceiver, and vice versa.

FIG. 1 illustrates an exemplary communications environment 1. The communications environment 1, in addition to well known componentry, includes transceiver 100, a second transceiver 200 and MIB 210, interconnected via one or more communications links 5. The transceivers 100 and 200 can include comparable componentry including message generation module 110, rate impact module 120, fault detection module 130, PSD (Power Spectral Density) module 140, attenuation curve library 150, comparison module 160, attenuation curve measurement module 170, best-fit module 180, a transmitter module 190, a receiver module 192, processor/controller 102 and memory 104.

In operation, and with the assistance of the attenuation curve measurement module 170, the best-fit module 180, and the attenuation curve library 150, an attenuation curve is found that corresponds to a possible loop without a fault that most closely matches a measured attenuation curve—this match will be referred to as the best-fit attenuation curve.

The attenuation curve library could be generated by direct measurements of loop attenuations or theoretical modeling of loop attenuations. Theoretical modeling of loop attenuations can be formulated in any of several ways ranging from simplified approximations to more accurate descriptions of the physics. One simplified example of an attenuation curve model is a straight line when attenuation is graphed as a function of frequency, in which case the slope and offset of the line could be stored in a lookup from the best fit to measurements or could also be parameterized as a function of loop topology. This approximation may be appropriate in a network where it is known a priori that there are no bridged taps, but it may not be appropriate if one or more bridged taps may be present on the measured loop. An example of a more accurate formulation of attenuation would be to use a formula such as:

$$H_M(f) = \log_{10}(4) - L_M \cdot \text{Re}\{\gamma(f)\} \cdot \log_{10}(e) - \log_{10}(|2 + \tan h(L_{T1} \cdot \gamma(f))|) - \log_{10}(|2 + \tan h(L_{T2} \cdot \gamma(f))|)$$

where $H_M(f)$ is given in dB, $\gamma(f)$ is the complex propagation constant of the wire, $L_M$ is the length of the main loop, $L_{T1}$ is the length of the first bridged tap, and $L_{T2}$ is the length of the second bridged tap, where in this example the loop consists of a uniform wire gauge.

An even more accurate formulation of attenuation would utilize "ABCD" modeling of the electrical networks, which is well established in the field. The aforementioned formulations of attenuation are but a few of the possible approaches. It should also be recognized that there are many possible approaches to finding the attenuation curve that most closely matches the measured attenuation curve. For example, forward modeling methods may be applied to search through the range of all possible topologies sampled at discrete points. Alternatively, inverse modeling techniques may be applied. Alternatively, some combination of forward and inverse modeling may be applied. The aforementioned approaches to finding the best fit attenuation curve are but a few of the possible approaches.

In cooperation with the processor 102 and attenuation curve measurement module 170, it may be necessary to first apply a correction to the measured attenuation curve vector to compensate for, for example, systematic biases in the data. This correction can be determined in advance and pre-stored, and/or it can be determined dynamically based upon known behavior of modems. It should also be apparent that the calibration may be applied in reverse to the curves in the attenuation curve library instead of applying calibration to the measurement. This correction factor may be omitted if the modems are known to produce attenuation curves that are accurate to within certain tolerances that are significantly smaller than the thresholds used for determining a fault condition. Sometimes, a simple calibration may need to be applied, such as by multiplying the measured attenuation by a constant scale factor. More often a slightly more complex calibration is needed that multiplies each tone of the measured attenuation by a scale factor that changes for each tone. A more complex yet more accurate calibration changes these tone-dependent scaled factors as a function of the loop topology. In this case, it may be more convenient to apply the calibration to each of the curves in the attenuation library instead of to the measurement, but it also is possible to use decision-directed methods to apply a loop-dependent calibration to the measurement. The aforementioned approaches to applying calibration are but a few of the possible approaches. To pre-determine the calibration curves, the most straightforward approach is to measure attenuation across a range of known loops, divide the measured attenuation curves per-tone by the theoretical models in the attenuation curve library, and store the resulting corrections in the calibration table. Alternatively, the corrections can be fit to a parametric model, and the model can be stored for later use in dynamically generating the corrections.

The comparison module 160 then compares the measured attenuation curve and the best-fit attenuation curve over one or more subchannels. The subchannels may be selected base on whether they are known to be sufficiently accurate or on one or more other criteria. The fault detection module 130 then determines, based on the comparison, whether one or more of the detectable fault types listed above are present on the communications channel. This may occur when the measured attenuation curve is significantly different than the best-fit attenuation curve, indicating that something present in the measurement (e.g., a metallic fault or other fault) is not being taken into account by the best-fit attenuation curve.

One exemplary approach for comparing the measured attenuation curve and the best-fit attenuation curve is to decide whether a fault is present would be to determine whether the following inequality is true:

MeasuredAttenuation/ModeledAttenuation<AttenuationErrorThreshold, where AttenuationErrorThreshold is a ratio that allows for modeling and measurement errors to occur without a tolerable rate of false fault detections and missed fault detections.

The message generation module 110 can then report whether a fault has been detected, a fault is known not to be present, or whether a determination cannot be made because, for example, the known inaccuracies of the system could alone cause the above inequality to be true.

This report may be done in a number of ways. For example, and in cooperation with the message generation module 110 and the transmitter module 190, a message or signal or indication may be sent to a user and/or service provider technician. Alternatively, or in addition, the report regarding fault detection may be reported over a management interface to a management entity, such as service provider MIB 210 (e.g., as defined in ITU G.997.1). A confidence metric may also be reported to a user, service technician and/or the MIB 210 indicating the extent to which the reported outcome is likely to correspond to reality.

In some cases, and with the cooperation of the rate impact module 120, the attainable data rate from the measured attenuation curve can be determined and subtracted from the attainable data rate determined from the best-fit attenuation curve, resulting in the rate impact from any fault that was detected. The rate impact estimates can be determined using any one of several link assumptions including the actual link parameters used to obtain the measured attenuation curve. In fact, the actual link data rate could be used directly instead of determining the data rate from the measured data. This rate impact from the fault can be reported to the user, service technician and/or the MIB 210.

The above analysis for determining the presence of the fault may also be performed on the attenuation curve values in aggregate optionally using a weighted combination.

For all links initiated to collect data as an input to the techniques disclosed herein, link settings may be set to maximize or increase the probability that relevant data can be collected. For example, because it may not be necessary to remain in Showtime for any extended period of time, if at all, a required SNR margin often can be set very low. Similarly, it may be advisable to set a minimum data rate requirement beyond any imposed by the standard or modem implementations. By allowing links to occur with fewer constraints, the exemplary techniques disclosed herein can potentially link and acquire data on more "difficult" lines (e.g., longer lines and/or lines that contain high noise).

Each time that the steps described above are exercised, the presence of a fault can be detected. If the presence of a fault is detected, it may not be possible to determine (using only the above steps) exactly how many faults are present. To accomplish this, and in cooperation with the message generation module 110, a user may be instructed to first identify, locate and remove at least one fault condition and then repeat the above steps. This process can be iteratively performed until, for example, no more faults are detected. An artifact of this iterative process is that it allows the user to determine how many faults are present on the line. Different approaches may be used to identify and locate the specific fault such as time-domain reflectometry (TDR), single-ended line testing (SELT) techniques, and/or narrow-band electrical measurements such as capacitance and resistance.

A confidence metric can also be formulated that quantifies the extent to which it is known that a fault is present on the line. This confidence metric can be formulated in terms of a probability given the information that is known, or some other metric that is informative to the user.

Note that the proposed techniques can also be used as a form of "domain location," which is to say that the steps can narrow down the probability that a particular problem occurs within some part of a network (e.g., inside the customer premises, inside the central office, in the cables in the field, in some specific portion of a network, etc). Given the situation when a fault is detected, the probability that the fault occurs in a specific domain can be conditioned on information about the prevalence of faults, metallic faults, malfunctioning hardware, etc.

Furthermore, if the fault is detected only in the downstream data but not in the upstream data, then additional information can be inferred about the type of fault. Similar conclusions could be inferred if the fault is detected only in the upstream data but not in the downstream data, if the fault is detected in both sets of data, or in neither set of data.

Figure 2:
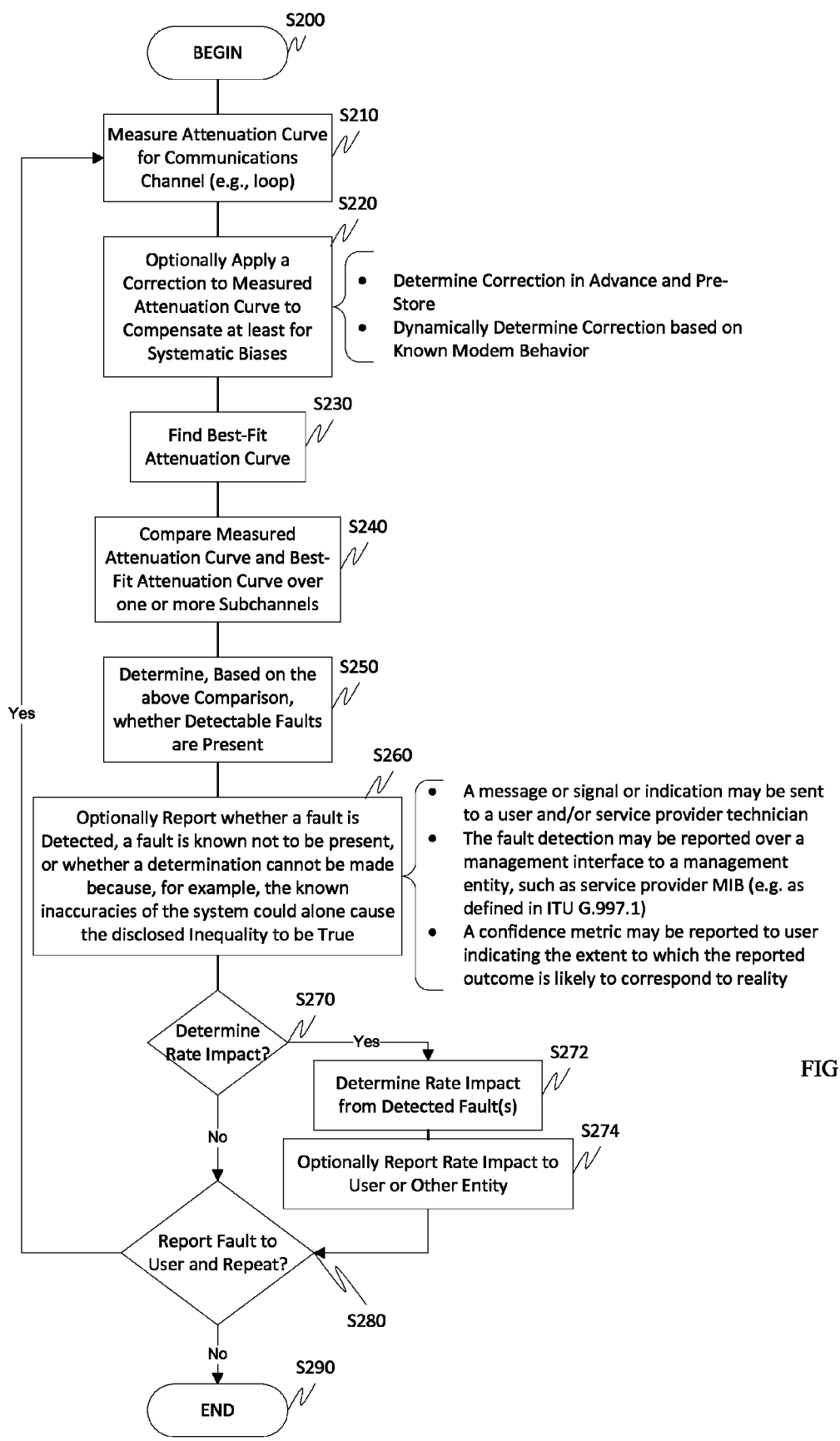
FIG. 2 is a flowchart outlining an exemplary method for determining whether faults are present on a communications channel.

FIG. 2 outlines an exemplary method for detecting faults. In particular, control begins in step S200 and continues to step S210. In step S210, the attenuation curve for the communications channel is measured. Next, in step S220, a correction can optionally be applied to the measured attenuation curve to compensate for one or more conditions such as systematic biases. As discussed, these corrections can be determined in advance and pre-stored, and/or they can be determined dynamically based upon known behavior of modems. Then, in step S230, a best-fit attenuation curve is found. Control then continues to step S240.

In step S240, the measured attenuation curve is compared to the best-fit attenuation curve over one or more subchannels. Next, based on the comparison in step S240, a determination is made whether fault(s) are present. Then, in step S260 reporting of the fault can optionally be performed. As discussed, the reporting can include information indicating whether a fault has been detected, whether a fault is known not to be present, or whether a determination cannot be made because, for example, the known inaccuracies of the system could alone cause the disclosed inequality to be true. This report can be sent to one or more of a user, technician and a MIB. Control then continues to step S270.

In step S270, a rate impact can optionally be determined. If a rate impact is to be determined, control continues to step S272 with control otherwise continuing to step S280. In step S272, the rate impact from the detected fault(s) is determined. Next, in step S274, the determined rate impact can optionally be reported to one or more of a user, service technician and the MIB. Control then continues to step S280.

In step S280, a determination is made whether the fault has been reported to the user and whether the steps should be repeated. For example, the user could be notified that there are one or more types of fault and that corrective action such as the addition of a microfilter, etc., needs to be installed. After the corrective action, the above steps could be repeated with control jumping back to step S210 to determine if one or more additional faults exist. Otherwise, control continues to step S290 where the control sequence ends.

As used herein the terms network and domain have the same meaning and are used interchangeably. The terms subcarrier, subchannel and tone also have the same meaning and are used interchangeably in the description. Also, the terms receiver, receiving node and receiving transceiver have the same meaning and are used interchangeably. Similarly, the terms transmitter, transmitting node and transmitting transceiver have the same meaning and are used interchangeably. The terms transceiver and modem also have the same meaning and are used interchangeably. While the term home network has been used in this description, the description is not limited to home networks but in fact applies also to any network, such as enterprise networks, business networks, or any network with a plurality of connected nodes. The terms transceiver, node and modem have the same meaning and are used interchangeably in the description. The term frame and packet have the same meaning and may be used interchangeably in the description. The term header and PHY-frame header have the same meaning and may be used interchangeably in the description.

The terms network and home network have the same meaning and are used interchangeably in the description. While the term home network has been used in this description, the description is not limited to home networks but in fact applies also to any network, such as enterprise networks, business networks, or any network with a plurality of connected nodes.

While the above-described methods and systems were described in relation to a transceiver, they can also be implemented in a dedicated module such as a test or network optimization module.

The above-described methods and systems and can be implemented in a software module, a software and/or hardware testing module, a telecommunications test device, a DSL modem, an ADSL modem, an xDSL modem, a VDSL modem, a linecard, a G.hn transceiver, a MOCA transceiver, a Homeplug transceiver, a powerline modem, a wired or wireless modem, test equipment, a multicarrier transceiver, a wired and/or wireless wide/local area network system, a satellite communication system, network-based communication systems, such as an IP, Ethernet or ATM system, a modem equipped with diagnostic capabilities, or the like, or on a separate programmed general purpose computer having a communications device or in conjunction with any of the following communications protocols: CDSL, ADSL2, ADSL2+, VDSL1, VDSL2, HDSL, DSL Lite, IDSL, RADSL, SDSL, UDSL, MOCA, G.hn, Homeplug® or the like.

Additionally, the systems, methods and protocols of this invention can be implemented on a special purpose computer, a programmed microprocessor or microcontroller and peripheral integrated circuit element(s), an ASIC or other integrated circuit, a digital signal processor, a flashable device, a hard-wired electronic or logic circuit such as discrete element circuit, a programmable logic device such as PLD, PLA, FPGA, PAL, a modem, a transmitter/receiver, any comparable means, or the like. In general, any device (or one or more equivalent means) capable of implementing a state machine that is in turn capable of implementing the methodology illustrated herein can be used to implement the various communication/measurement methods, protocols and techniques according to this invention.

Furthermore, the disclosed methods may be readily implemented in software stored on a non-transitory computer-readable information storage media using, for example, object or object-oriented software development environments that provide portable source code that can be used on a variety of computer or workstation platforms. Alternatively, the disclosed system may be implemented partially or fully in hardware using standard logic circuits or VLSI design. Whether software or hardware is used to implement the systems in accordance with this invention is dependent on the speed and/or efficiency requirements of the system, the particular function, and the particular software or hardware systems or microprocessor or microcomputer systems being utilized. The communication systems, methods and protocols illustrated herein can be readily implemented in hardware and/or software using any known or later developed systems or structures, devices and/or software by those of ordinary skill in the applicable art from the functional description provided herein and with a general basic knowledge of the computer and telecommunications arts.

Moreover, the disclosed methods may be readily implemented in software that can be stored on a computer-readable storage medium, executed on programmed general-purpose computer with the cooperation of a controller and memory, a special purpose computer, a microprocessor, or the like. The systems and methods of this invention can be implemented as a program embedded on personal computer such as an applet, JAVA® or CGI script, as a resource residing on a server or computer workstation, as a routine embedded in a dedicated communication system or system component, or the like. The system can also be implemented by physically incorporating the system and/or method into a software and/or hardware system, such as the hardware and software systems of a test/modem device.

While the invention is described in terms of exemplary embodiments, it should be appreciated that individual aspects of the invention could be separately claimed and one or more of the features of the various embodiments can be combined.

While the exemplary embodiments illustrated herein discuss the various components collocated, it is to be appreciated that the various components of the system can be located a distant portions of a distributed network, such as a telecommunications network and/or the Internet or within a dedicated communications network. Thus, it should be appreciated that the components of the system can be combined into one or more devices or collocated on a particular node of a distributed network, such as a telecommunications network. As will be appreciated from the following description, and for reasons of computational efficiency, the components of the communications network can be arranged at any location within the distributed network without affecting the operation of the system.

It is therefore apparent that there has been provided, in accordance with the present invention, systems and methods for communications diagnostics. While this invention has been described in conjunction with a number of embodiments, it is evident that many alternatives, modifications and variations would be or are apparent to those of ordinary skill in the applicable arts. Accordingly, it is intended to embrace all such alternatives, modifications, equivalents and variations that are within the spirit and scope of this invention.

The invention claimed is:

1. A system comprising:
   circuitry configured to detect a fault in a communication line, the circuitry configured to compare a measured attenuation curve with a best-fit attenuation curve, wherein the measured attenuation curve is reported by a modem, and the best-fit attenuation curve is determined iteratively by comparing to the measured attenuation curve is pre-stored models of attenuation curves that could occur for loops that do not contain metallic faults; and
   a message generation module adapted to generate a confidence metric which quantifies an extent to which it is known that the fault is present on the communication line,
   wherein after the fault is corrected the circuitry is configured to compare another measured attenuation curve to another best-fit attenuation curve to detect a presence of another fault.

2. A method of detecting the presence of a fault in a communication line comprising:
   comparing with circuitry a measured attenuation curve with a best-fit attenuation curve, wherein the measured attenuation curve is reported by a modem, and the best-fit attenuation curve is determined iteratively by comparing to the measured attenuation curve pre-stored models of attenuation curves that could occur for loops that do not contain metallic faults; and
   generating a confidence metric which quantifies an extent to which it is known that the fault is presented on the communication line,
   wherein after the fault is corrected the circuitry is configured to compare another measured attenuation curve to another best-fit attenuation curve to detect a presence of another fault.

3. A non-transitory computer-readable information storage media having stored thereon instructions that when executed by a processor causes a comparison between a measured attenuation curve with a best-fit attenuation curve, wherein the measured attenuation curve is reported by a modem, and the best-fit attenuation curve is determined iteratively by comparing to the measured attenuation curve pre-stored models of possible attenuation curves that could occur for loops that do not contain metallic faults; and generates a confidence metric which quantifies an extent to which it is known that the fault is present on a communication line, wherein after the fault is corrected the circuitry is configured to compare another measured attenuation curve to another best-fit attenuation curve to detect a presence of another fault.

4. A system for detecting the presence of a fault comprising:

means for comparing a measured attenuation curve with a best-fit attenuation curve, wherein the measured attenuation curve is reported by a modem, and the best-fit attenuation curve is determined by iterative means that compare to the measured attenuation curve pre-stored models of attenuation curves that could occur for loops that do not contain metallic faults; and means for generating a confidence metric which quantifies an extent to Which it is known that the fault is present on a communication line, wherein after the fault is corrected the means for comparing also compares another measured attenuation curve to another best-fit attenuation curve to detect a presence of another fault.

5. The system of claim 1, wherein a user is notified of the detection of a metallic fault or malfunctioning modem.

6. The system of claim 1, wherein additional links are performed to identify additional metallic faults or malfunctioning modems.

7. The system of claim 1, wherein the detection of a metallic fault or malfunctioning modem is reported to a management entity via a management interface.

8. A method for determining one or more faults in a communications channel comprising:

measuring an attenuation curve for the communications channel;

finding a best-fit attenuation curve, including determining the best-fit attenuation curve by iteratively comparing to the attenuation curve pre-stored attenuation curves for loops that do not contain metallic faults;

comparing the measured attenuation curve and the best-fit attenuation curve over one or more subchannels;

determining, based on the comparison, whether one or more detectable faults are present; and generating a confidence metric which quantifies an extent to which it is known that the fault is present on a communication line, and repeating_the measuring, finding, comparing and determining steps once a first fault is corrected.

9. A system for determining one or more faults in a communications channel comprising:

means for measuring an attenuation curve for the communications channel;

means for finding a best-fit attenuation curve, including determining the best-fit attenuation curve by iteratively comparing to the attenuation curve pre-stored attenuation curves for loops that do not contain metallic faults;

means for comparing the measured attenuation curve and the best-fit attenuation curve over one or more subchannels;

means for determining, based on the comparison, whether one or more detectable faults are present; and means for generating a confidence metric which quantifies an extent to which it is known that the fault is present on a communication line, and once a first fault is corrected identifying another fault with the means for measuring, means for finding, means for comparing and means for determining.

10. A non-transitory computer-readable information storage media having stored thereon instructions that if executed by a processor cause to be performed a method for determining one or more faults in a communications channel comprising:

measuring an attenuation curve for the communications channel;

finding a best-fit attenuation curve, including determining the best-fit attenuation curve by iteratively comparing to the attenuation curve pre-stored attenuation curves for loops that do not contain metallic faults;

comparing the measured attenuation curve and the best-fit attenuation curve over one or more subchannels;

determining, based on the comparison, whether one or more detectable faults are present; and generating a confidence metric which quantifies an extent to which it is known that the fault is present on a communication line, and repeating the measuring, finding, comparing and determining steps once a first fault is corrected.

11. A system comprising:

circuitry configured to determine one or more faults in a communications channel, the circuitry configured to implement an attenuation curve measurement module that is capable of measuring an attenuation curve for the communications channel;

a best-fit attenuation module capable of finding a best-fit attenuation curve, including determining the best-fit attenuation curve by iteratively comparing to the attenuation curve pre-stored attenuation curves for loops that do not contain metallic faults;

a comparison module capable of comparing the measured attenuation curve and the best-fit attenuation curve over one or more subchannels;

a fault detection module capable of determining, based on the comparison, whether one or more detectable faults are present; and a message generation module adapted to generate a confidence metric which quantifies an extent to which it is known that the fault is present on a communication line, wherein said circuitry is configured to identify another fault after a first fault is corrected.

12. The method of claim 8, further comprising applying a correction to the measured attenuation curve.

13. The method of claim 8, further comprising reporting whether the first fault has been detected.

14. The method of claim 8, further comprising reporting, that a determination regarding a presence of the first fault cannot be made.

15. The method of claim 8, further comprising determining a rate impact.

16. The method of claim 8, further comprising determining a rate impact and reporting the same.

17. The method of claim 8, further comprising repeating the measuring, finding, comparing and determining steps.

18. The method of claim 8, further comprising querying an attenuation curve library.

19. The method of claim 8, further comprising applying a correction to the measured attenuation curve, wherein the correction is one or more of:

multiplying the measured attenuation by a constant scale factor, multiplying each tone of the measured attenuation by a scale factor that changes for each tone, changing tone-dependent scaled factors as a function of the loop topology using pre-determined calibration curves, wherein attenuation across a range of known loops is measured, the measured attenuation curves per-tone are divided by the theoretical models in the attenuation curve library, the resulting corrections stored in a calibration table, and fitting corrections to a parametric model, wherein the model is stored for later use in dynamically generating the corrections.

20. The method of claim 8, further comprising selecting one or more subchannels.

21. The method of claim 8, wherein rate impact estimates can be determined using a link assumption that includes actual link parameters used to obtain the measured attenuation curve.

22. The method of claim 8, wherein the comparing of the measured attenuation curve and the best-fit attenuation curve to determine whether a fault is present is based on determining whether the following inequality is true:

$$\text{MeasuredAttenuation}/\text{ModeledAttenuation} < \text{AttenuationErrorThreshold},$$

where AttenuationErrorThreshold is a ratio that allows for modeling and measurement errors to occur without a tolerable rate of false fault detections and missed fault detections.

* * * * *

UNITED STATES PATENT AND TRADEMARK OFFICE
CERTIFICATE OF CORRECTION

| | | |
|---|---|---|
| PATENT NO. | : 9,130,655 B2 | Page 1 of 1 |
| APPLICATION NO. | : 13/502199 | |
| DATED | : September 8, 2015 | |
| INVENTOR(S) | : Christopher C. Cunningham et al. | |

It is certified that error appears in the above-identified patent and that said Letters Patent is hereby corrected as shown below:

Claims

Column 10, line 32, claim 1 Delete "is" after "curve".

Column 11, line 19, claim 4 Change "to Which" to --to which--.

Column 11, line 46, claim 8 Change "repeating_the measuring" to --repeating the measuring--.

Signed and Sealed this
Twenty-second Day of March, 2016

Michelle K. Lee
*Director of the United States Patent and Trademark Office*